(12) United States Patent
Salgueiro et al.

(10) Patent No.: US 7,978,089 B2
(45) Date of Patent: Jul. 12, 2011

(54) METHOD AND APPARATUS FOR GROUND FAULT DETECTION

(76) Inventors: David John Salgueiro, Cranford, NJ (US); Dominic D'souza, Howell, NJ (US)

( * ) Notice: Subject to any disclaimer, the term of this patent is extended or adjusted under 35 U.S.C. 154(b) by 303 days.

(21) Appl. No.: 12/211,648

(22) Filed: Sep. 16, 2008

(65) Prior Publication Data

US 2010/0066552 A1 Mar. 18, 2010

(51) Int. Cl.
*G08B 21/00* (2006.01)

(52) U.S. Cl. .......... 340/650; 340/652; 340/661; 361/42

(58) Field of Classification Search .......... 340/650, 340/649, 652, 657, 660, 661, 662, 663, 664, 340/691.1, 691.6; 361/46, 42, 56
See application file for complete search history.

(56) References Cited

U.S. PATENT DOCUMENTS

| | | | | |
|---|---|---|---|---|
| 3,911,323 A | * | 10/1975 | Wilson et al. | 361/42 |
| 4,459,582 A | * | 7/1984 | Sheahan et al. | 340/539.16 |
| 6,144,537 A | * | 11/2000 | Boteler | 361/42 |
| 7,312,964 B2 | * | 12/2007 | Tchernobrivets | 361/42 |
| 7,529,069 B1 | * | 5/2009 | Weems et al. | 361/42 |

* cited by examiner

*Primary Examiner* — Toan N Pham

(57) ABSTRACT

In one embodiment, the present invention is a method and apparatus for ground fault detection. One embodiment of a method for diagnosing a ground fault in a notification appliance circuit comprising a plurality of field wiring connections includes individually testing each of the plurality of field wiring connections until a source of the ground fault is detected and outputting a signal identifying the source of the ground fault.

23 Claims, 4 Drawing Sheets

US 7,978,089 B2

METHOD AND APPARATUS FOR GROUND FAULT DETECTION

FIELD OF THE INVENTION

The present invention generally relates to fire alarm field wiring circuits, and more particularly relates to detecting ground faults in field wiring circuits.

BACKGROUND OF THE DISCLOSURE

In many fire alarm field wiring circuits, the wires must be enclosed in a metal conduit in order to comply with building codes. This metal conduit is typically bonded (electrically and mechanically connected) to earth ground. During installation, it is possible for the field wiring to short to earth ground; such condition is referred to as a "ground fault."

Many safety standards, including the Underwriters Laboratories (UL) 864 standard, require that ground faults be detected and, when detected, reported. Conventional ground fault detection system compare a DC voltage applied to earth ground with a reference voltage; the resulting circuit detects a ground fault when any field wires come into contact with earth ground. However, such systems do not indicate which field wire has come into contact with earth ground and triggered the ground fault. Thus, in order to identify the source of the ground fault, a service technician must power down the fire alarm system (completely, including backup battery power) and then measure the resistance between each field wiring terminal and earth ground. This process is slow, tedious, and can lead to errors, especially if the service technician is not well-trained in ground fault troubleshooting methods Thus, there is a need in the art for a method and apparatus for ground fault detection that automatically identifies the source of a ground fault.

SUMMARY OF THE INVENTION

In one embodiment, the present invention is a method and apparatus for ground fault detection. One embodiment of a method for diagnosing a ground fault in a notification appliance circuit comprising a plurality of field wiring connections includes individually testing each of the plurality of field wiring connections until a source of the ground fault is detected and outputting a signal identifying the source of the ground fault.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

In one embodiment, the present invention is a method and apparatus for ground fault detection. Embodiments of the invention detect and identify which field wiring circuit(s) in a notification appliance has come into contact with earth ground. This enables a service technician to accurately and efficiently diagnose ground fault trouble simply by activating the ground fault detection system. Embodiments of the invention may be deployed to detect ground faults on a variety of output circuits including, but not limited to: contact closure (CC) outputs, sync outputs, notification appliance circuit (NAC) outputs, and auxiliary (AUX) outputs.

Figure 1:
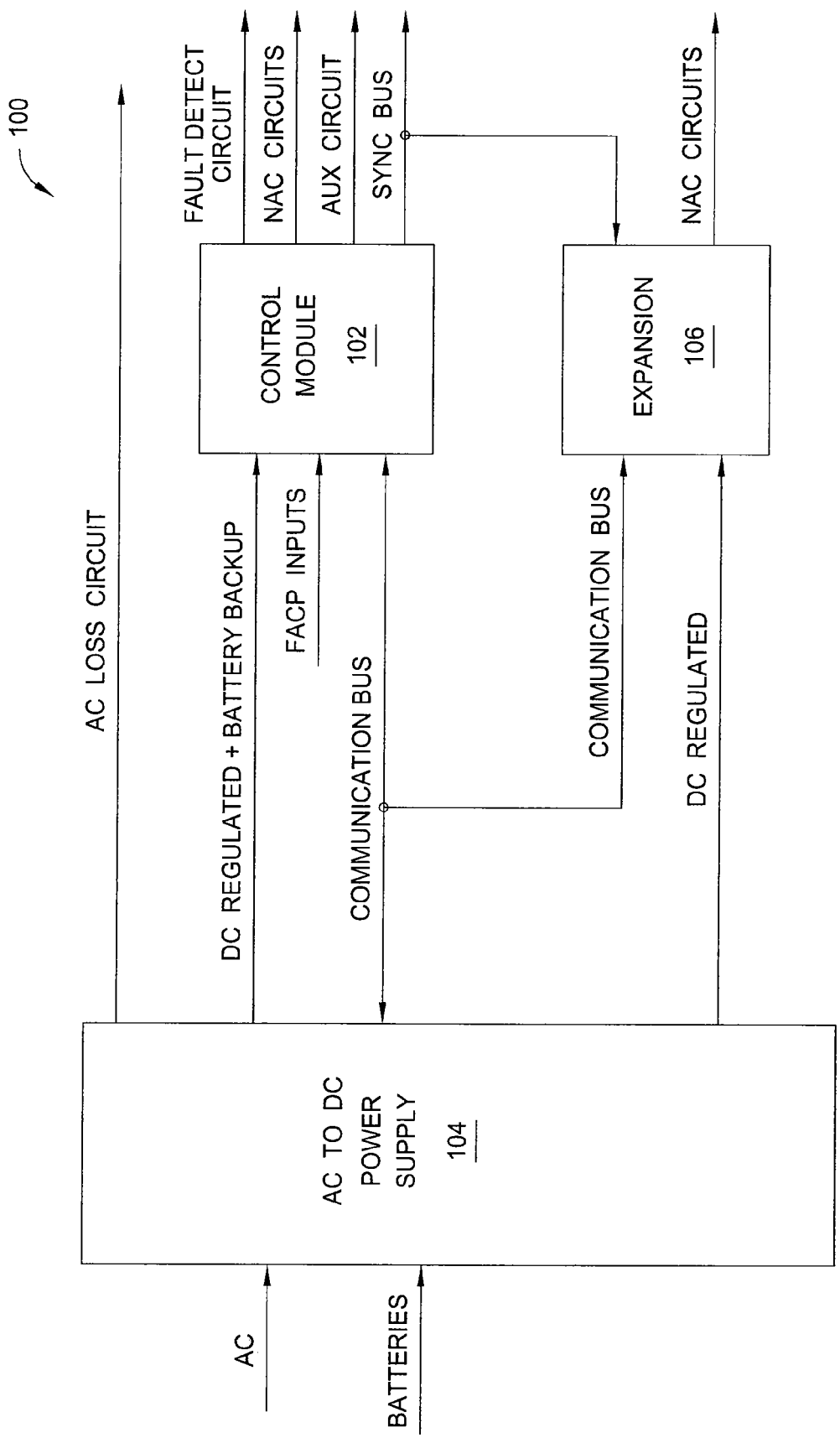
FIG. 1 is a schematic diagram illustrating one embodiment of a system for detecting ground faults, according to the present invention.

FIG. 1 is a schematic diagram illustrating one embodiment of a system 100 for detecting ground faults, according to the present invention. The system 100 may be coupled, for example, to a notification appliance such as a fire alarm system (not shown).

The system 100 comprises a control module 102 and a power supply 104, which are coupled to each other by a plurality of connections including, for example, communications buses, regulated DC connections, and battery backup connections. In one embodiment, the control module 102 and the power supply 104 are connected by twenty-eight volt regulated DC connections. In one embodiment, the power supply 104 is an AC to DC power supply.

In one embodiment, the control module 102 is a notification appliance circuit (NAC) extender. The control module 102 is coupled to and powers the inputs on a notification appliance. To this end, the control module 102 receives power from the power supply 104, and provides the power to a plurality of outputs. These outputs in turn power one or more of the following: NAC circuits (e.g., for notification appliances), auxiliary circuits (e.g., for ancillary devices) and ground fault detection circuits (e.g., for detecting ground faults in the NAC and/or auxiliary circuits).

In one embodiment, the system 100 further comprises an optional expansion module 106. The expansion module 106 is connected to the power supply 104 by a plurality of connections, including, for example, communications buses, regulated DC connections. The expansion module 106 is also connected to the control module 102 by a sync bus. The expansion module 106 is configured in a manner similar to the control module 102; however, logic for detecting ground faults is maintained in and operated by the control module 102, which may control the circuitry of the expansion module 106 for the purposes of ground fault detection.

In one embodiment, the power supply 104 is configured on a first printed circuit board, while the control module 102 and expansion module 106, if included, are configured on a second printed circuit board.

Figure 2:
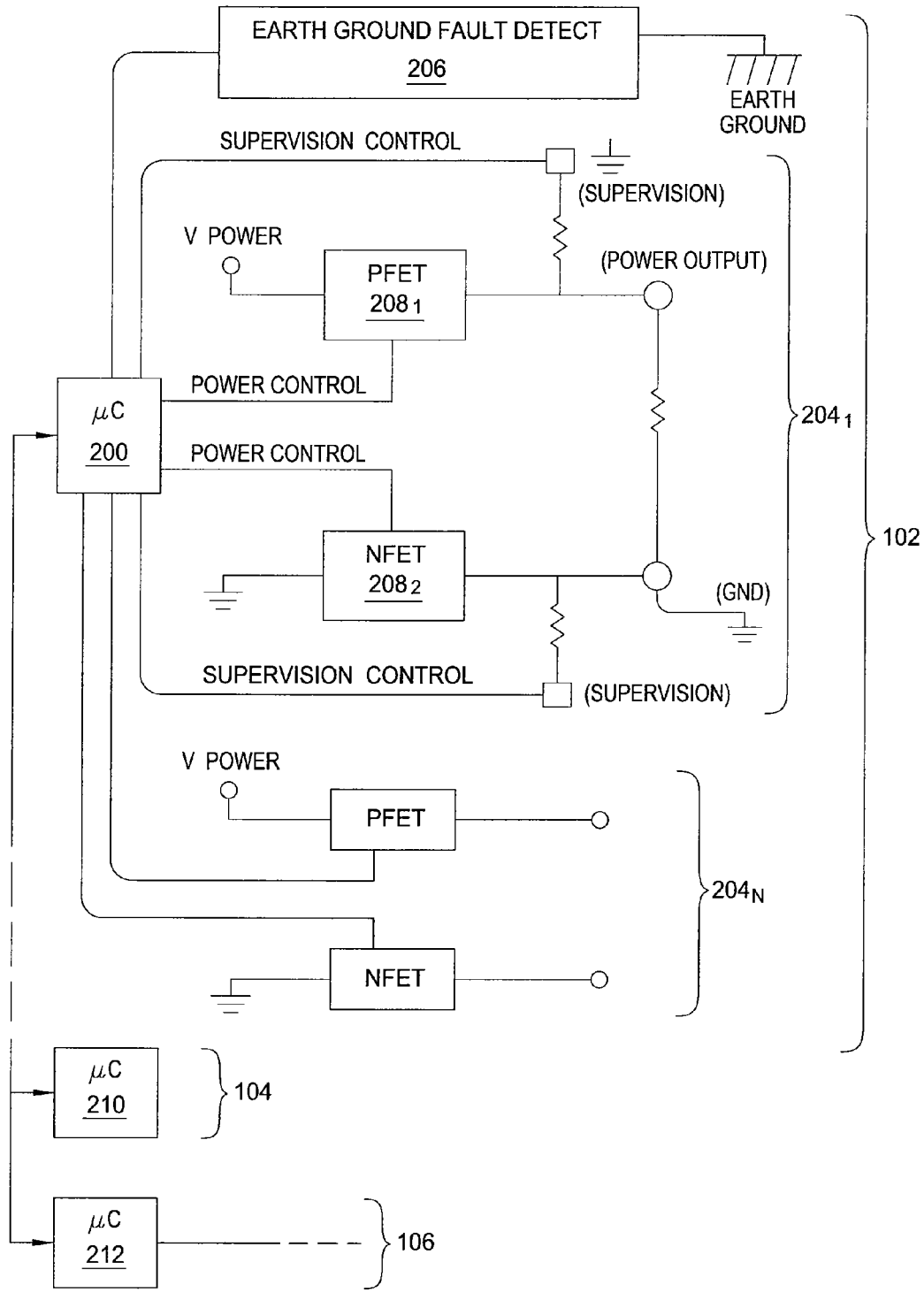
FIG. 2 is a schematic diagram illustrating one embodiment of a control module.

FIG. 2 is a schematic diagram illustrating one embodiment of a control module 102. As illustrated, the control module 102 comprises a microcontroller 200 and a plurality of NAC outputs $204_1$-$204_n$ (hereinafter collectively referred to as "NAC outputs 204") connected to and controlled by the microcontroller 200. In addition, the microcontroller 200 is connected to earth ground fault detection circuitry 206, which is configured for detecting ground faults on the NAC outputs 204.

For ease of illustration, only NAC output $204_1$ is illustrated in detail in FIG. 2; each of the NAC outputs 204 in the control module 102 is configured in a similar manner. In one embodiment, the control module 102 comprises four NAC outputs 204. As illustrated, each NAC output 204 comprises a field wiring connection comprising a pair of switching elements $208_1$ and $208_2$ (hereinafter collectively referred to as "switching elements 208"). Although the switching elements 208 in FIG. 2 are illustrated as metal oxide semiconductor field effect transistors (MOSFETs), the switching elements 208 may comprise any type of switching element, including, for example, transistors. A first switching element $208_1$ is connected to power, while the second switching element $208_2$ is connected to ground.

As described in further detail with reference to FIG. 3, when operating in a mode to detect ground faults in an associated notification appliance, the microcontroller 200 individually isolates each of the NAC outputs 204 in order to determine which NAC output 204 is the source of a detected ground fault. As described, the present invention can identify not only the individual NAC output 204 that is the source of the ground fault, but also which of the switching elements 208 comprising the NAC output 204 is the source.

The microcontroller 200 for the control module 102 is further connected to a microcontroller 210 for the power supply 104, as well as a microcontroller 212 for the expansion module 106, if an expansion module is deployed. In one embodiment, the control module's microcontroller 200 communicates with the expansion module's microcontroller 212 in order to isolate the NAC outputs of the expansion module 106 for detection of ground faults.

Figure 3:
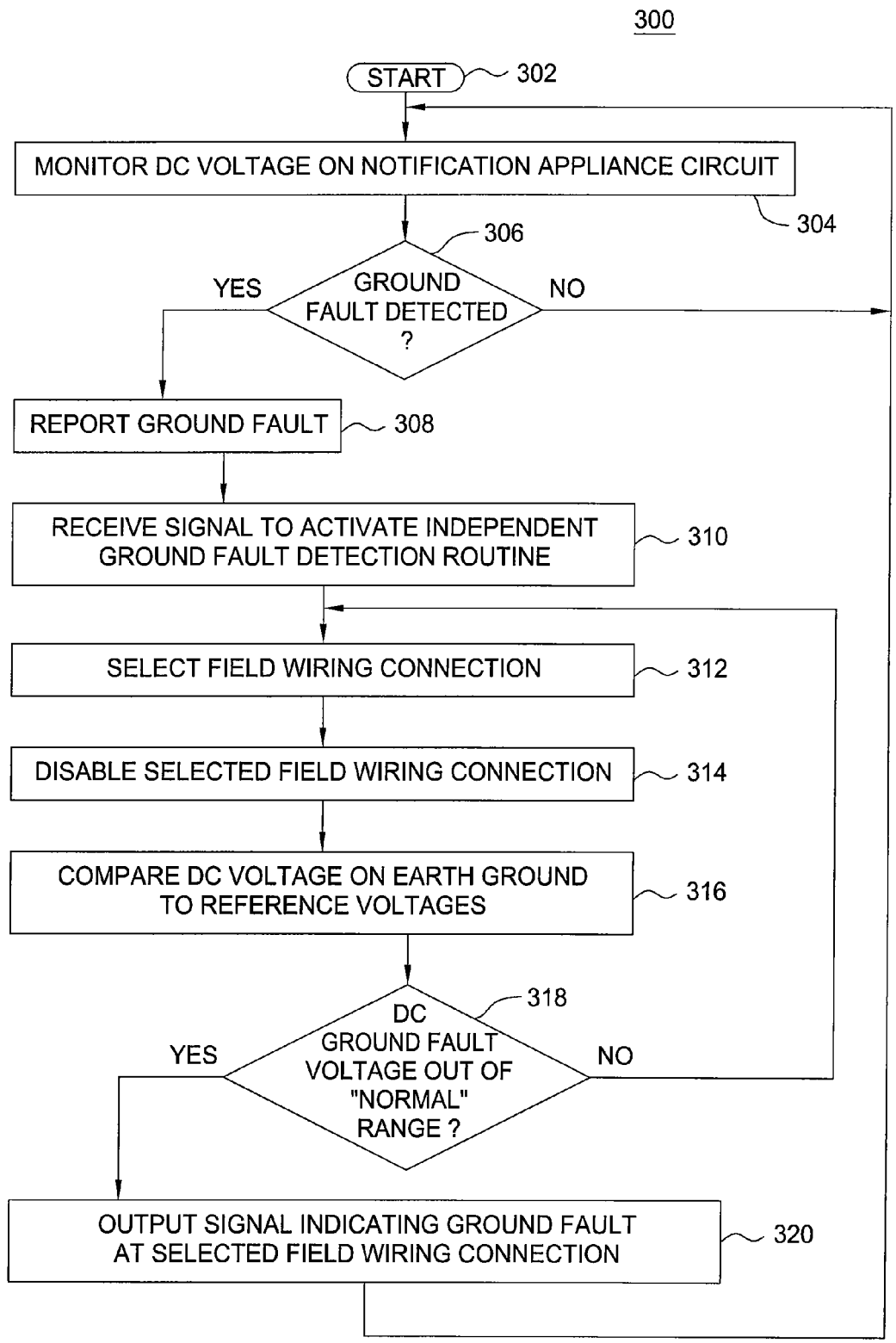
FIG. 3 is a flow diagram illustrating one embodiment of a method for diagnosing ground fault, according to the present invention.

FIG. 3 is a flow diagram illustrating one embodiment of a method 300 for diagnosing ground fault, according to the present invention. The method 300 may be implemented, for example, in the microcontroller 200 and earth ground fault detection circuitry 206 illustrated in FIG. 2.

The method 300 is initialized at step 302 and proceeds to step 304, where the microcontroller of the control module monitors the DC voltage on a ground fault circuit associated with the control module (which may be a NAC). In one embodiment, the microcontroller uses a built-in analog-to-digital converter to monitor the voltage.

In step 306, the microcontroller determines whether a ground fault has been detected. In one embodiment, the microcontroller detects a ground fault by comparing the DC voltage present on earth ground to one or more reference voltages. In one embodiment, the DC voltage present on earth ground represents a ground fault if the DC voltage is above a "high" ground fault reference voltage (i.e., an upper threshold) or below a "low" ground fault reference voltage (i.e., a lower threshold).

If the microcontroller concludes in step 306 that a ground fault has not been detected, the method 300 returns to step 304 and the microcontroller continues to monitor the DC voltage on the control module. Alternatively, if the microcontroller concludes in step 306 that a ground fault has been detected, the method 300 proceeds to step 308 and the microcontroller reports the detected ground fault. In one embodiment, the microcontroller reports the ground fault by activating a visual indicator, such as a light-emitting diode (LED) connected to the notification appliance.

In step 310, the microcontroller receives a signal to activate an independent ground fault detection routine. In one embodiment, this signal is received from a human operator (e.g., via the push of a button or the flip of a switch), such as a service technician responding to the report generated in step 308. Once the independent ground fault detection routine has been activated, the microcontroller communicates with the earth ground fault detection circuitry to determine the source of the ground fault.

In step 312, the microcontroller begins the independent ground fault detection routine by selecting a field wiring connection in the notification appliance for testing. In step 314, the microcontroller isolates or disables the selected field wiring connection. In one embodiment, the selected field wiring connection is disabled by activating the switching elements on the selected field wiring connection.

In step 316, the microcontroller compares the DC voltage on earth ground to the reference voltages. The method 300 then proceeds to step 318, where the microcontroller determines whether the DC voltage on earth ground is outside of a "normal" voltage range (i.e., above the "high" ground fault reference voltage or below the "low" ground fault reference voltage).

If the microcontroller concludes in step 318 that the DC voltage on earth ground is outside of the normal range (i.e., the selected field wiring connection is the source of the ground fault), the method 300 proceeds to step, where the microcontroller outputs a signal indicating a ground fault at the selected field wiring circuit. In one embodiment, the signal is a visual signal, such as the illumination of one or more LEDs to display a unique trouble code. The signal identifies the selected field wiring connection as the field wiring connection having the ground fault, as well as which switching element of the field wiring connection is responsible for the ground fault. The method 300 then returns to step 304 and proceeds as described above to monitor the DC voltage on the control module.

Alternatively, if the method 300 concludes in step 318 that the DC voltage on earth ground is within the normal range (i.e., the selected field wiring circuit is not the source of the ground fault), the method 300 returns to step 312 and selects a next field wiring connection for testing in accordance with the procedure described above. This process of selecting field wiring connections continues until the method 300 identifies the field wiring connection that is the source of the ground fault.

In one embodiment, if the microcontroller has disabled all field wiring connections in the control module (and expansion module, if used) and has not identified the field wiring connection that is the source of the ground fault, the microcontroller outputs a signal indicating that a ground fault has been detected, but not located in the field wiring. In such a case, the power supply (e.g., power supply 104 of FIG. 1), may be the source of the ground fault.

Thus, the method 300 isolates each input and output to the earth ground fault detection circuitry one at a time in order to determine which of the inputs and outputs has the ground fault trouble condition. In one embodiment, coded trouble LEDs in the notification appliance are used to display the specific input or output associated with the ground fault trouble condition.

Embodiments of the invention may be extended to the supervision of field wiring (including that in other devices) via a full-time synchronous signal. In one embodiment, a supervision mode is a limited power mode similar to a "stand by" mode, in which the microcontroller of the control module checks for opens and shorts. In this embodiment, the synchronous signals are patterns in which DC power is enabled and disabled. Thus, the microcontroller of the control module may toggle between this supervision mode and an active mode in which ground faults are actively detected and identified. Moreover, multiple control modules may be connected to a fully supervised sync bus in order to substantially ensure that the control modules will always be in sync.

Figure 4:
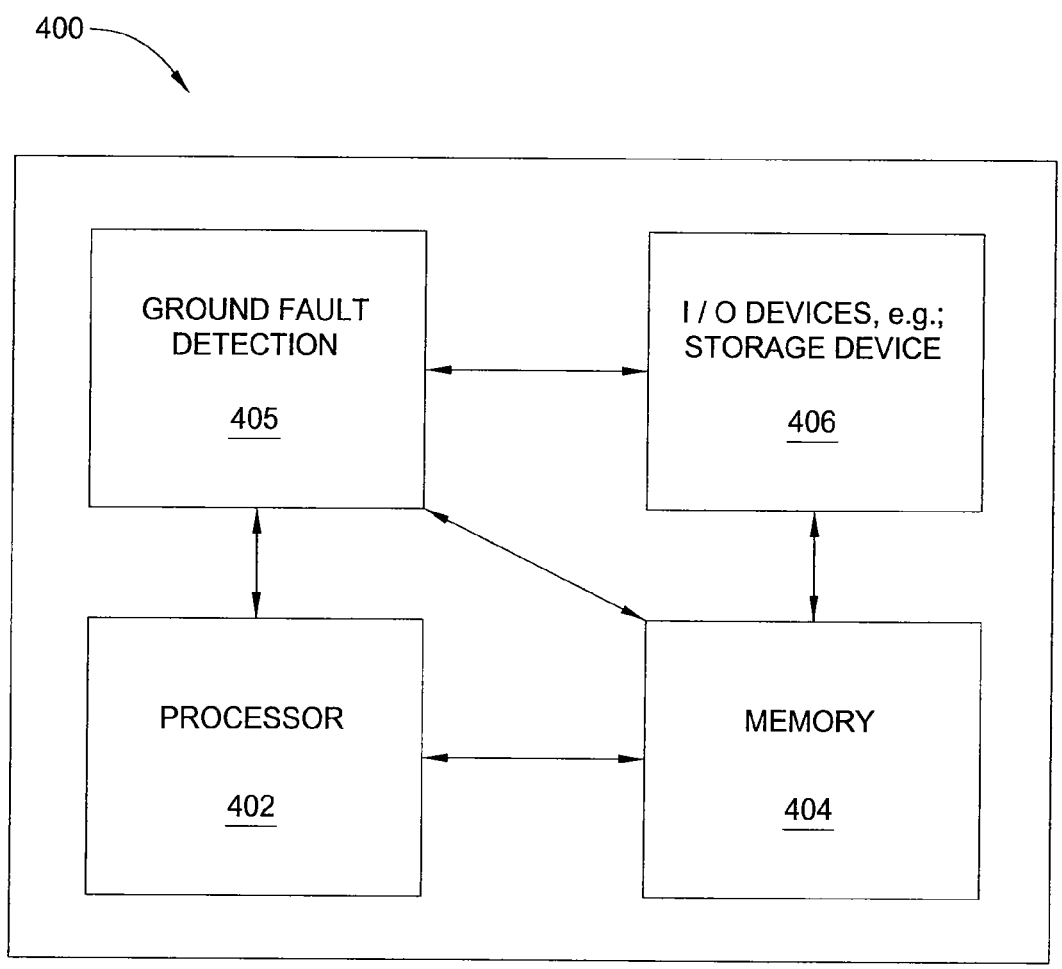
FIG. 4 is a high level block diagram of the ground fault detection method that is implemented using a general purpose computing device.

FIG. 4 is a high level block diagram of the ground fault detection method that is implemented using a general purpose computing device 400. In one embodiment, a general purpose computing device 400 comprises a processor 402, a memory 404, a ground fault detection module 405 and various input/output (I/O) devices 406 such as a display, a keyboard, a mouse, a modem, a network connection and the like. In one embodiment, at least one I/O device is a storage device (e.g., a disk drive, an optical disk drive, a floppy disk drive). It should be understood that the ground fault detection module 405 can be implemented as a physical device or subsystem that is coupled to a processor through a communication channel.

Alternatively, the ground fault detection module 405 can be represented by one or more software applications (or even a combination of software and hardware, e.g., using Application Specific Integrated Circuits (ASIC)), where the software is loaded from a storage medium (e.g., I/O devices 906) and operated by the processor 402 in the memory 404 of the general purpose computing device 400. Additionally, the software may run in a distributed or partitioned fashion on two or more computing devices similar to the general purpose computing device 400. Thus, in one embodiment, the ground fault detection module 405 for detecting ground faults in field wiring connections described herein with reference to the preceding figures can be stored on a computer readable medium or carrier (e.g., RAM, magnetic or optical drive or diskette, and the like).

It should be noted that although not explicitly specified, one or more steps of the methods described herein may include a storing, displaying and/or outputting step as required for a particular application. In other words, any data, records, fields, and/or intermediate results discussed in the methods can be stored, displayed, and/or outputted to another device as required for a particular application. Furthermore, steps or blocks in the accompanying Figures that recite a determining operation or involve a decision, do not necessarily require that both branches of the determining operation be practiced. In other words, one of the branches of the determining operation can be deemed as an optional step. Moreover, although steps of the methods described above may be illustrated in a certain sequence, those skilled in the art will appreciate that the steps of the methods described need not necessarily occur in the order illustrated. Thus, the accompanying Figures do not illustrate a mandatory sequential order.

Although various embodiments which incorporate the teachings of the present invention have been shown and described in detail herein, those skilled in the art can readily devise many other varied embodiments that still incorporate these teachings.

What is claimed is:

1. A method for diagnosing a ground fault in a notification appliance circuit comprising a plurality of field wiring connections, the method comprising:
    individually testing each of the plurality of field wiring connections until a source of the ground fault is detected, wherein the testing comprises, for each of the plurality of field wiring connections:
        disabling a selected one of the plurality of field wiring connections;
        comparing a DC voltage on earth ground of the notification appliance circuit with one or more reference voltages; and
        detecting the ground fault in accordance with the comparing; and
    outputting a signal identifying the source of the ground fault.

2. The method of claim 1, wherein the one or more reference voltages comprise at least one of: an upper threshold voltage and a lower threshold voltage.

3. The method of claim 2, wherein the detecting comprises ruling out the selected one of the plurality of field wiring connections as the source of the ground fault if the DC voltage on earth ground of the notification appliance circuit is below the lower threshold voltage after disabling the selected one of the plurality of field wiring connections.

4. The method of claim 2, wherein the detecting comprises ruling out the selected one of the plurality of field wiring connections as the source of the ground fault if the DC voltage on earth ground of the notification appliance circuit is above the upper threshold voltage after disabling the selected one of the plurality of field wiring connections.

5. The method of claim 2, wherein the detecting comprises identifying the selected one of the plurality of field wiring connections as the source of the ground fault if the DC voltage on earth ground of the notification appliance circuit is not below the lower threshold voltage or above the upper threshold after disabling the selected one of the plurality of field wiring connections.

6. The method of claim 1, wherein the outputting comprises:
    displaying a code via one or more light emitting diodes, the code uniquely identifying the source of the ground fault.

7. The method of claim 1, wherein the notification appliance circuit is a fire alarm system.

8. The method of claim 1, wherein the signal identifies at least one of: a field wiring circuit associated with the ground fault and a switching element of the field wiring circuit.

9. The method of claim 1, further comprising:
    monitoring a DC voltage of the notification appliance circuit continuously for ground faults.

10. A computer readable storage medium containing an executable program for diagnosing a ground fault in a notification appliance circuit comprising a plurality of field wiring connections, where the program performs steps of:
    individually testing each of the plurality of field wiring connections until a source of the ground fault is detected, wherein the testing comprises, for each of the plurality of field wiring connections:
        disabling a selected one of the plurality of field wiring connections;
        comparing a DC voltage on earth ground of the notification appliance circuit with one or more reference voltages; and
        detecting the ground fault in accordance with the comparing; and
    outputting a signal identifying the source of the ground fault.

11. The computer readable storage medium of claim 10, wherein the one or more reference voltages comprise at least one of: an upper threshold voltage and a lower threshold voltage.

12. The computer readable storage medium of claim 11, wherein the detecting comprises ruling out the selected one of the plurality of field wiring connections as the source of the ground fault if the DC voltage on earth ground of the notification appliance circuit is below the lower threshold voltage after disabling the selected one of the plurality of field wiring connections.

13. The computer readable storage medium of claim 11, wherein the detecting comprises ruling out the selected one of the plurality of field wiring connections as the source of the ground fault if the DC voltage on earth ground of the notification appliance circuit is above the upper threshold voltage after disabling the selected one of the plurality of field wiring connections.

14. The computer readable storage medium of claim 11, wherein the detecting comprises identifying the selected one of the plurality of field wiring connections as the source of the ground fault if the DC voltage on earth ground of the notification appliance circuit is not below the lower threshold voltage or above the upper threshold after disabling the selected one of the plurality of field wiring connections.

15. The computer readable storage medium of claim 10, wherein the outputting comprises:
displaying a code via one or more light emitting diodes, the code uniquely identifying the source of the ground fault.

16. The computer readable storage medium of claim 10, wherein the notification appliance circuit is a fire alarm system.

17. The computer readable storage medium of claim 10, wherein the signal identifies at least one of: a field wiring circuit associated with the ground fault and a switching element of the field wiring circuit.

18. The computer readable storage medium of claim 10, further comprising:
monitoring a DC voltage of the notification appliance circuit continuously for ground faults.

19. Apparatus for diagnosing a ground fault in a notification appliance circuit comprising a plurality of field wiring connections, comprising:
ground fault detection circuitry for individually testing each of the plurality of field wiring connections until a source of the ground fault is detected, wherein the testing comprises, for each of the plurality of field wiring connections:
disabling a selected one of the plurality of field wiring connections;
comparing a DC voltage on earth ground of the notification appliance circuit with one or more reference voltages; and
detecting the ground fault in accordance with the comparing; and
a microcontroller for outputting a signal identifying the source of the ground fault.

20. The apparatus of claim 19, further comprising one or more light emitting diodes, which, when activated by the microcontroller, display a code uniquely identifying the source of the ground fault.

21. The apparatus of claim 19, wherein the notification appliance circuit is a fire alarm system.

22. The apparatus of claim 19, wherein the signal identifies at least one of: a field wiring circuit associated with the ground fault and a switching element of the field wiring circuit.

23. The apparatus of claim 19, wherein the microcontroller is further configured to monitor a DC voltage of the notification appliance circuit continuously for ground faults.

* * * * *